(12) United States Patent
Ryu

(10) Patent No.: US 6,259,299 B1
(45) Date of Patent: Jul. 10, 2001

(54) CMOS LEVEL SHIFT CIRCUIT FOR INTEGRATED CIRCUITS

(75) Inventor: In-Hyo Ryu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/387,605

(22) Filed: Aug. 31, 1999

(30) Foreign Application Priority Data

Sep. 24, 1998 (KR) .................................................. 98-39815

(51) Int. Cl.[7] ....................................................... H03L 5/00
(52) U.S. Cl. ........................... 327/333; 327/390; 326/63; 326/81
(58) Field of Search .................................... 327/333, 390, 327/401, 589; 326/63, 68, 80, 81

(56) References Cited

U.S. PATENT DOCUMENTS

| | | | | |
|---|---|---|---|---|
| 5,493,245 | * | 2/1996 | Kao et al. .............................. | 327/333 |
| 5,646,563 | * | 7/1997 | Kuo ...................................... | 327/157 |
| 5,650,742 | * | 7/1997 | Hirano .................................. | 327/333 |
| 5,912,577 | * | 6/1999 | Takagi .................................. | 327/333 |
| 6,001,290 | * | 12/1999 | Avery et al. ......................... | 327/333 |
| 6,133,757 | * | 10/2000 | Huang et al. ......................... | 326/87 |

\* cited by examiner

Primary Examiner—Jung Ho Kim
(74) Attorney, Agent, or Firm—F. Chau & Associates, LLP

(57) ABSTRACT

There is provided a level shift circuit which includes an input terminal for receiving a logic input signal changing between a first voltage and a reference voltage. An output terminal provides a logic output signal changing between a second voltage and the reference voltage. A pull-up transistor has a control electrode and a pair of controlled electrodes. The controlled electrodes are coupled between the second voltage and the output terminal. A pull-down transistor has a control electrode and a pair of controlled electrodes. The control electrode of the pull-down transistor is coupled to the input terminal, and the controlled electrodes of the pull-down transistor are coupled between the reference voltage and the output terminal. A charge/discharge circuit charges the control electrode of the pull-up transistor with the second voltage when the logic input signal is changed from the reference voltage to the first voltage. The charge/discharge circuit discharges the control electrode of the pull-up transistor to the reference voltage when the logic input signal is changed from the first voltage to the reference voltage.

11 Claims, 2 Drawing Sheets

CM OS LEVEL SHIFT CIRCUIT FOR INTEGRATED CIRCUITS

FIELD OF THE INVENTION

The present invention relates to a level shift circuit for use in integrated circuits and, more particularly, to a CMOS level shift circuit.

BACKGROUND OF THE INVENTION

The manufacturing techniques of semiconductor devices have been gradually advancing. As such, integrated circuits have been proportionally affected.

The internal circuitry of an integrated circuit often operates at different power source voltages (e.g., 3V and 5V). FIG. 1 is a schematic diagram of a conventional CMOS level shift circuit for an integrated circuit. The CMOS level shift circuit generally includes an inverter circuit having a PMOS transistor PM1 and an NMOS transistor NM1. The PMOS transistor PM1 has a source coupled to a power source voltage $V_{CC2}$ (e.g., 5V), a drain coupled to an output terminal 30, and a gate coupled to an input terminal 10. The NMOS transistor NM1 has a drain coupled to the output terminal 10, a source coupled to a ground voltage $V_{SS}$ (e.g., 0V), and a gate coupled to the input terminal 10. The gates of the PMOS transistor PM1 and the NMOS transistor NM1 are coupled to each other. Here, the power source voltage $V_{CC2}$ is an operating voltage of the internal circuitry of the integrated circuit.

When the low voltage (e.g., 0V) is input to the input terminal 10, the low voltage is applied to the gate of the PMOS transistor PM1 and the NMOS transistor NM1. Accordingly, the PMOS transistor PM1 is on and the NMOS transistor NM1 is off, so that the power source voltage $V_{CC2}$ is applied to the output terminal 30 through the PMOS transistor PM1.

On the other hand, when the high voltage (e.g., 3V) is input to the input terminal 10, the high voltage is applied to the gate of the PMOS transistor PM1 and the NMOS transistor NM1. Thus, the NMOS transistor NM1 is on, and the PMOS transistor PM1 is weakly on in a static state due to a voltage difference between the gate voltage (e.g., 3V) of the PMOS transistor PM1 and the power source voltage $V_{CC2}$ (e.g. 5V). Therefore, a current path is formed between the power source voltage $V_{CC2}$ and the ground voltage $V_{SS}$, so that a leakage current flows into the inverter circuit via the undesired current path of the PMOS transistor PM1.

Accordingly, there is a problem in the conventional CMOS level shift circuit shown above in that power consumption of the conventional CMOS level shift circuit may occur when the high voltage (e.g., 3V) is input to the input terminal 10. As the voltage difference between the gate voltage (e.g., 3V) of the PMOS transistor and the power source voltage $V_{CC2}$ (e.g., 5V) is increased in the static state, the power consumption also increases in proportion thereto.

SUMMARY OF THE INVENTION

The present invention is directed to a level shift circuit for an integrated circuit. The level shift circuit of the present invention advantageously includes a charge/discharge circuit capable of receiving an input voltage which is different from a power source voltage applied to internal circuitry of the integrated circuit. Moreover, the level shift circuit advantageously prevents a leakage current from flowing into an inverter circuit included in the level shift circuit.

According to an aspect of the present invention, a level shift circuit is provided which includes an input terminal for receiving a logic input signal changing between a first voltage and a reference voltage. An output terminal provides a logic output signal changing between a second voltage and the reference voltage. A pull-up transistor has a control electrode and a pair of controlled electrodes. The controlled electrodes are coupled between the second voltage and the output terminal. A pull-down transistor has a control electrode and a pair of controlled electrodes. The control electrode of the pull-down transistor is coupled to the input terminal, and the controlled electrodes of the pull-down transistor are coupled between the reference voltage and the output terminal. A charge/discharge circuit charges the control electrode of the pull-up transistor with the second voltage when the logic input signal is changed from the reference voltage to the first voltage. The charge/discharge circuit discharges the control electrode of the pull-up transistor to the reference voltage when the logic input signal is changed from the first voltage to the reference voltage.

The charge/discharge circuit includes a first switching device coupled between the second voltage and the control electrode of the pull-up transistor for supplying the second voltage to the control electrode of the pull-up transistor when the output signal is equal to the reference voltage. The first switching device inhibits the supply of the second voltage to the control electrode of the pull-up transistor when the output signal is equal to the second voltage.

The charge discharge circuit also includes a second switching device coupled between the input terminal and the control electrode of the pull-up transistor for supplying the control electrode voltage of the pull-up transistor to the reference voltage in response to the reference voltage. The second switching device inhibits the supply of the control electrode voltage of the pull-up transistor to the reference voltage in response to the first voltage.

The first switching device is a PMOS transistor, and the second switching device is an NMOS transistor. A channel of the PMOS transistor is less a channel of the NMOS transistor. The pull-up transistor is a PMOS transistor, and the pull-down transistor is an NMOS transistor.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

Figure 2:
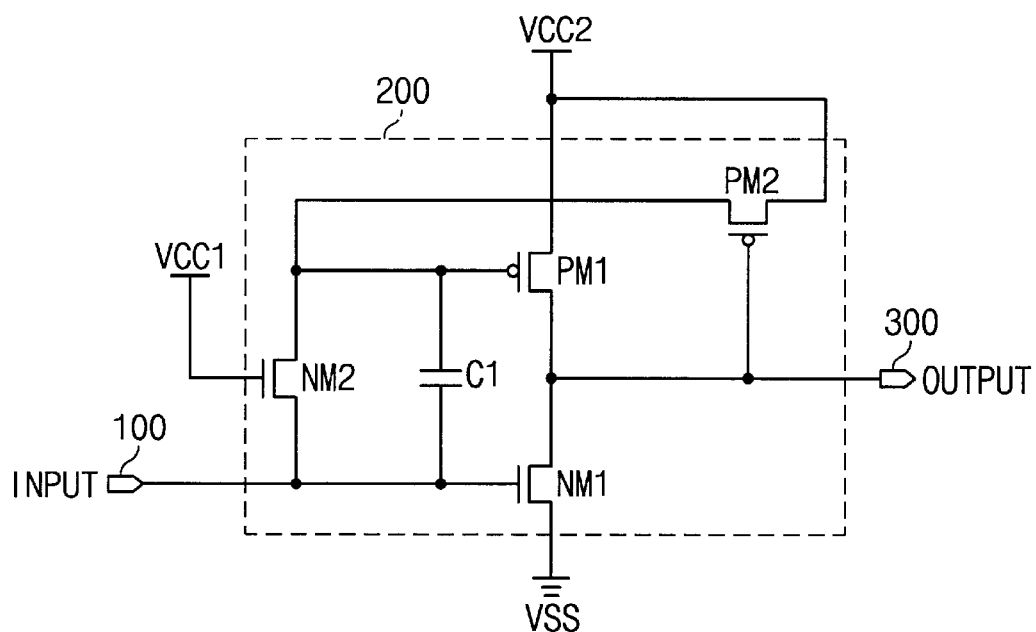
FIG. 2 is a schematic diagram of a CMOS level shift circuit for an integrated circuit according to a preferred embodiment of the present invention.

FIG. 2 is a schematic diagram of a CMOS level shift circuit for an integrated circuit according to preferred embodiment of the present invention. The CMOS level shift circuit includes an input terminal 100 for receiving an input signal which changes between a first voltage $V_{CC1}$ (e.g., 3V) and a reference voltage or a ground voltage $V_{SS}$. The CMOS level shift circuit also includes an output terminal 300 for providing an output signal which changes between a second voltage $V_{CC2}$ (e.g., 5V) and the ground voltage $V_{SS}$.

A pull-up transistor, that is, a PMOS transistor PM1, has a source coupled to the second voltage $V_{CC2}$, a drain coupled to the output terminal 300, and a gate or a control electrode coupled to the input terminal 100 through an NMOS transistor NM2. A pull-down transistor, that is, an NMOS transistor NM1, has a drain coupled to the output terminal 300, a source coupled to the ground voltage $V_{SS}$, and a gate coupled to the input terminal 100.

A charge/discharge circuit charges the gate of the PMOS transistor PM1 with the second voltage $V_{CC2}$, when the input signal is changed from the ground voltage $V_{SS}$ to the first voltage $V_{CC1}$. The charge/discharge circuit discharges the gate of the PMOS transistor PM1 to the ground voltage $V_{SS}$, when the input signal is changed from the first voltage $V_{CC1}$ to the ground voltage $V_{SS}$.

The charge/discharge circuit includes a first switching means such as, for example, a PMOS transistor PM2 coupled between the second voltage $V_{CC2}$ and the gate of the PMOS transistor PM1. The PMOS transistor PM2 is turned on and supplies the second voltage VCC2 to the gate of the PMOS transistor PM1, when the output signal is discharged by the NMOS transistor NM1. On the other hand, the PMOS transistor PM2 is turned off and does not supply (i.e., inhibits) the second voltage VCC2 to the PMOS transistor PM1, when the output signal is charged by the PMOS transistor PM1. The size of the PMOS transistor PM2 is small, as it is designed to transmit a small current.

A second switching means such as NMOS transistor NM2 is coupled between the input terminal 100 and the gate of the PMOS transistor PM1. The NMOS transistor NM2 is turned on and supplies the gate voltage of the PMOS transistor PM1 to the ground voltage $V_{SS}$, when the input signal is equal to the ground voltage $V_{SS}$. On the other hand, the NMOS transistor NM2 is turned off and does not supply (i.e., inhibits) the gate voltage of the PMOS transistor PM1 to the ground voltage $V_{SS}$, when the input signal is equal to the first voltage VCC1 (i.e., when the voltage at the base of the NMOS transistor NM2 is equal to the first voltage VCC1).

A capacitor C1 is coupled between the gate of the PMOS transistor PM1 and the gate of the NMOS transistor NM1. The capacitor C1 improves a charging/discharging time of the gate voltage of the PMOS transistor PM1, as is apparent to those skill in the art.

Figure 1:
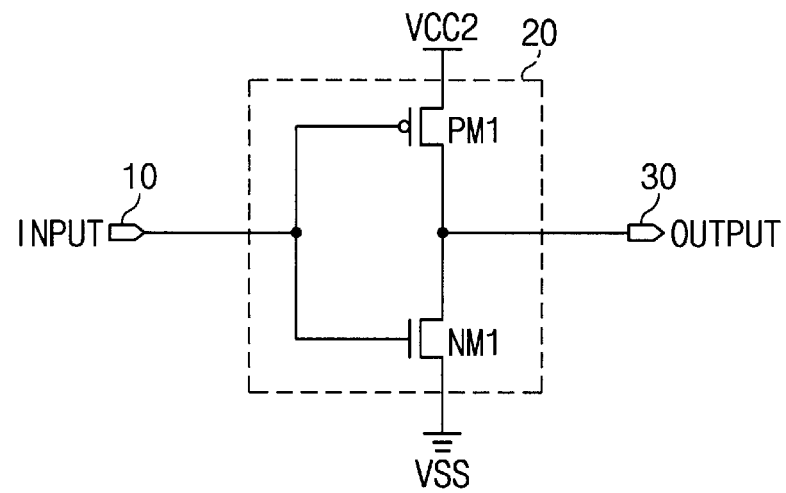
FIG. 1 is a schematic diagram of a conventional CMOS level shift circuit for an integrated circuit.

A channel of the PMOS transistor PM2 is smaller than that of the NMOS transistor NM2. The channel of the PMOS transistor PM1 is smaller than that of the NMOS transistor NM1 so as to consume a small current, similar to the CMOS level shift circuit of FIG. 1.

Operation of the above CMOS level shift circuit according to the invention will be described hereinbelow. Referring to FIG. 2, assume that an integrated circuit (not shown) operating at a high voltage (e.g., 3V) outputs a digital signal (e.g., a binary signal) of a low level to the input terminal 100 of the integrated circuit operating at a different high voltage (e.g., 5V). Since the internal circuitry of the integrated circuit operates at 5V, the input signal is 0V or 5V.

When the input signal (0V) is input to the input terminal 100, the 0V is applied to the gate of the PMOS transistor PM1 through the NMOS transistor NM2 and simultaneously to the gate of the NMOS transistor NM1. Thus, the PMOS transistor PM1 is on and the NMOS transistor NM1 is off.

As a result, the second voltage $V_{CC2}$ is applied to the output terminal 300 through the PMOS transistor PM1. Thereafter, the output voltage (e.g., 5V) from the output terminal 300 is applied to the gate of the PMOS transistor PM2, so that the PMOS transistor PM2 is off and the current path is not enabled between the second voltage $V_{CC2}$ and the ground voltage $V_{SS}$. Thus, the output voltage is continuously outputted from the output terminal 300 to the internal circuitry without power consumption. In sum, the input voltage of 0V is inverted to the output voltage of 5V by the CMOS level shift circuit 200, so that the output voltage of 5V may be supplied to the internal circuitry of the integrated circuit.

When the input signal (3V) is input to the input terminal 100, the 3V is applied to the gate of the NMOS transistor NM1. Thus, the NMOS transistor NM1 is turned on, and the output voltage from the output terminal 300 is discharged to the ground voltage $V_{SS}$. Since the gate voltage of the PMOS transistor PM2 is decreased, the PMOS transistor PM2 is turned on. The second voltage $V_{CC2}$ is applied to the gate of the PMOS transistor PM1 through the PMOS transistor PM2. Thus, the gate voltage of the PMOS transistor PM1 becomes high by as much as the second voltage $V_{CC2}$ (5V) when the input signal is high (3V) in the static state. Consequently and advantageously, the PMOS transistor PM1 is off so that the leakage current does not flow into the inverter circuit. In that case, a drain voltage of the NMOS transistor NM2 is 5V and a source voltage of the NMOS transistor NM2 is 3V. Thus, the NMOS transistor NM2 is turned off, so that the gate voltage (5V) of the PMOS transistor PM1 is not provided to the input terminal 100. Therefore, the current path between the second voltage $V_{CC2}$ and the ground voltage $V_{SS}$ is not enabled. Accordingly, power consumption can be prevented in the static state. In sum, the input voltage of 3V is inverted to the output voltage of 0V by the CMOS level shift circuit 200, so that the output voltage of 0V may be supplied to the internal circuitry of the integrated circuit without power consumption.

The capacitor C1 improves the operating performance of the input signal, when the input signal transitions from the high level to the low level or from the low level to the high level.

Figure 3A:
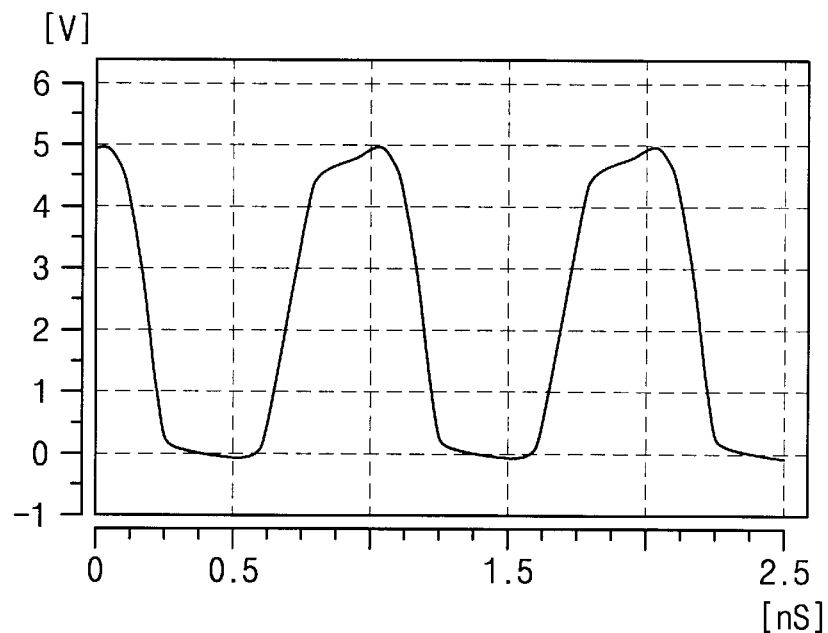
FIG. 3A is a waveform diagram of an illustrative output signal from an output terminal of the CMOS level shift circuit of FIG. 2.
Figure 3B:
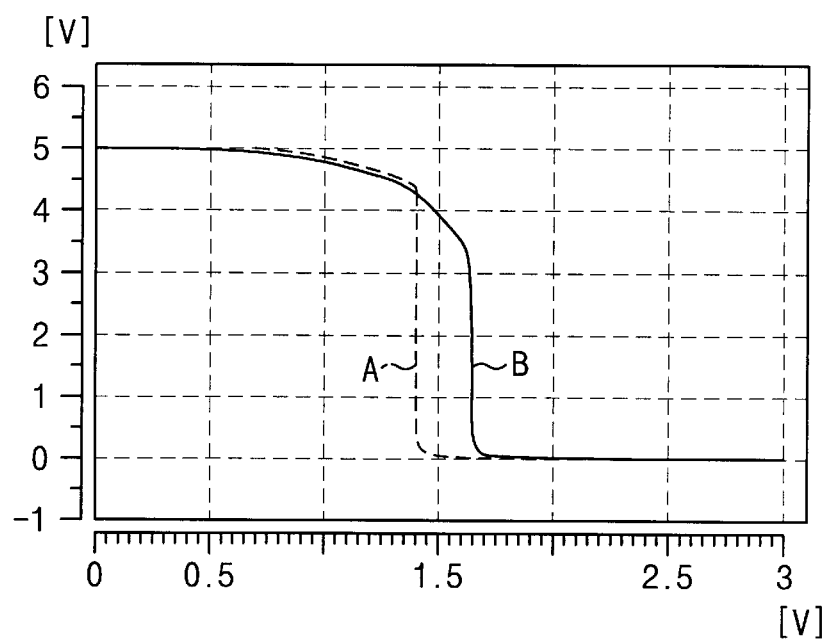
FIG. 3B is a waveform diagram of a voltage level change of the CMOS level shift circuit of FIG. 2.

FIG. 3A is a waveform diagram of an illustrative output signal from the output terminal of the CMOS level shift circuit of FIG. 2. FIG. 3B is a waveform diagram of a voltage level change of the CMOS level shift circuit of FIG. 2. In FIG. 3A, the output signal is a transient response waveform generated in response to an input signal of 1 GHz. At this time, the input signal is inverted by the CMOS inverter which is of a minimum size.

In FIG. 3B, a dotted line A is used to represent a threshold voltage (1.38V) at which the input signal changes from the first voltage $V_{CC1}$ (e.g. 3V) to the ground voltage $V_{SS}$, and a solid line B is used to represent a threshold voltage (1.61V) at which the input signal changes from the ground voltage $V_{SS}$, to the first voltage $V_{CC1}$ (e.g., 3V).

As shown in FIG. 2, when the input signal (0V) is input to the input terminal 100, the second voltage $V_{CC2}$ is applied to the output terminal 300 through the PMOS transistor PM1. Thus, the output voltage of 5V is supplied to the internal circuitry of the integrated circuit. As shown in FIG. 3B, as the input signal is increased to the second threshold voltage of 1.61V, the current path of the PMOS transistor PM1 becomes narrow and the current path of the NMOS transistor NM1 becomes wide. Thus the output voltage is gradually decreased.

However, when the input signal reaches the second threshold voltage of 1.61V, the NMOS transistor NM1 is turned on. The output voltage is discharged by the NMOS transistor NM1, so that the PMOS transistor PM2 is turned on. Thus, the second voltage $V_{CC2}$ is supplied to the gate of the PMOS transistor PMI. Therefore, the PMOS transistor PM1 and the NMOS transistor NM2 are turned off. Accordingly, the output voltage of 0V is supplied to the internal circuitry of the integrated circuit without power consumption.

On the other hand, when the input signal is changed from the first voltage $V_{CC2}$ (e.g., 3V) to the ground voltage $V_{SS}$, the NMOS transistor NN2 is initially off. However, when the input signal gradually decreases, the NMOS transistor NM2 is turned on so that the gate voltage of the PMOS transistor PM1 is discharged to the ground voltage $V_{SS}$ through the NMOS transistor NM2. When the input signal reaches the first threshold voltage of 1.38V, the gate voltage of the PMOS transistor PM1 is turned on and the NMOS transistor NM1 is turned off, so that the second voltage $V_{CC2}$ (e.g., 5V) is applied to the output terminal 300 through the PMOS transistor PM1. Thus, the PMOS transistor PM2 is turned off and the second voltage $V_{CC2}$ is not applied to the gate of the PNIOS transistor PM1. Accordingly, the output voltage of 5V is applied to the internal circuitry of the integrated circuit without power consumption.

As is evident from the above description, the CMOS level shift circuit has a hysteresis characteristic. Notice that as the input voltage starts at 0V and transitions to 3V, the output voltage does not change until the input voltage reaches the threshold voltage (1.61V) Once the output voltage goes high, the effective threshold voltage has changed. When the input voltage starts at 3V and transitions to 0V, the output voltage does not change until the input voltage reaches the trip voltage (1.38V). The advantage of hysteresis in a noisy environment is known to those skilled in the art.

As described above, the CMOS level shift circuit of the present invention advantageously includes a charge/discharge circuit capable of receiving an input voltage which is different from a power source voltage applied to internal circuitry of the integrated circuit. Accordingly, the CMOS level shift circuit of the present invention advantageously prevents a leakage current from flowing into an inverter circuit included in the CMOS level shift circuit. Moreover, a consumption of power by the CMOS level shift circuit of the present invention is advantageously prevented when the high voltage (e.g., 3V) is input to the input terminal during a static state.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A level shift circuit, comprising:
an input terminal for receiving a logic input signal changing between a first voltage and a reference voltage:
an output terminal for providing a logic output signal changing between a second voltage and the reference voltage;
a pull-up transistor having a control electrode and a pair of controlled electrodes, the controlled electrodes being coupled to the second voltage and the output terminal, respectively;
a pull-up transistor having a control electrode and a pair of controlled electrodes, the control electrode of the pull-down transistor being coupled to the input terminal, the controlled electrodes of the pull-down transistor being coupled between the reference voltage and the output terminal; and
a charge/discharge circuit for charging the control electrode of the pull-up transistor with the second voltage when the logic input signal is changed from the reference voltage to the first voltage, and discharging the control electrode of the pull-up transistor to the reference voltage when the logic input signal is changed from the first voltage to the reference voltage, wherein the charge/discharge circuit further comprises a capacitor coupled between the control electrode of the pull-up transistor and the control electrode of the pull-down transistor, for improving a charging/discharging time of a voltage of the control electrode of the pull-up transistor.

2. A level shift circuit, comprising:
an input terminal for inputting an input signal transitional from a first voltage associated with a first voltage supply to a reference voltage associated with a reference voltage supply;
an output terminal for outputting an output signal transitional from a second voltage associated with a second voltage supply to the reference voltage;
a pull-up transistor having a control electrode and a pair of controlled electrodes, the controlled electrodes being coupled to the second voltage supply and the output terminal, respectively;
a pull-down transistor having a control electrode and a pair of controlled electrodes, the control electrode of the pull-down transistor being coupled to the input terminal, the controlled electrodes of the pull-down transistor being coupled between the reference voltage supply and the output terminal; and
first switching means coupled between the second voltage supply and the control electrode of the pull-up transistor for supplying the second voltage to the control electrode of the pull-up transistor when the output signal is discharged by the pull-down transistor, and for not supplying the second voltage to the control electrode of the pull-up transistor when the output signal is charged by the pull-up transistor; and
second switching means coupled between the input terminal and the control electrode of the pull-up transistor for supplying the control electrode voltage of the pull-up transistor to the reference voltage when the input signal is equal to the reference voltage, and for not supplying the control electrode voltage of the pull-up transistor to the reference voltage when the input signal is equal to the first voltage, wherein said first and second switching means form a charge/discharge circuit for charging the control electrode of the pull-up transistor with the second voltage when the input signal transitions from the reference voltage to the first voltage, and discharging the control electrode of the pull-up transistor to the reference voltage when the input signal transitions from the first voltage to the reference voltage, and the charge/discharge circuit further comprises a capacitor coupled between the control electrode of the pull-up transistor and the control electrode of the pull-down transistor, for improving a charging/discharging time of a voltage of the control electrode of the pull-up transistor.

3. A level shift circuit, comprising:

an input terminal for inputting an input signal transitional from a first voltage associated with a first voltage supply to a reference voltage associated with a reference voltage supply;

an output terminal for outputting an output signal transitional from a second voltage associated with a second voltage supply to the reference voltage;

a first PMOS transistor having a control electrode and a pair of controlled electrodes, the controlled electrodes being coupled to the second voltage supply and the output terminal, respectively;

a first NMOS transistor having a control electrode and a pair of controlled electrodes, the control electrode of the first NMOS transistor being coupled to the input terminal, the controlled electrodes of the first NMOS transistor being coupled between the reference voltage supply and the output terminal; and a second PMOS transistor coupled between the second voltage supply and the control electrode of the first PMOS transistor for supplying the second voltage to the control electrode of the first PMOS transistor when the output signal is discharged by the first NMOS transistor, and for not supplying the second voltage to the control electrode of the first PMOS transistor when the output signal is charged by the first PMOS transistor; and a second NMOS transistor coupled between the input terminal and the control electrode of the first PMOS transistor for supplying the control electrode voltage of the first PMOS transistor to the reference voltage when the input signal is equal to the reference voltage, and for not supplying the control electrode voltage of the first PMOS transistor to the reference voltage when the input signal is equal to the first voltage, wherein said second PMOS and NMOS transistors form a charge/discharge circuit for charging the control electrode of the first PMCS transistor with the second voltage when the input signal transitions from the reference voltage to the first voltage, and discharging the control electrode of the first PMOS transistor to the reference voltage when the input signal transitions from the first voltage to the reference voltage, and the charge/discharge circuit further comprises a capacitor coupled between the control electrode of the first PMOS transistor and the control electrode Of the first NMOS transistor, for improving a charging/discharging time of a voltage of the control electrode of the first PMOS transistor.

4. The level shift circuit according to claim 1, wherein the charge/discharge circuit comprises:

first switching means coupled between the second voltage and the control electrode ofthe pull-up transistor for supplying the second voltage to the control electrode ofthe pull up transistor when the output signal is discharged by the pull-down transistor, and for inhibiting the supply of the second voltage to the control electrode of the pull-up transistor when the output signal is charged by the pull-up transistor; and second switching means coupled between the input terminal and the control electrode of the pull-up transistor for supplying the control electrode voltage of the pull-up transistor to the reference voltage when the input signal is equal to the reference voltage, and for inhibiting the supply ofthe control electrode voltage ofthe pull-up transistor to the reference voltage when the input signal is equal to the first voltage.

5. The level shift circuit according to claim 4, wherein the first switching means is a PMOS transistor, and the second switching means is an NMOS transistor.

6. The level shift circuit according to claim 5, wherein a length of a channel of the PMOS transistor is less than a length of a channel of the NMOS transistor.

7. The level shift circuit according to claim 1, wherein said pull-up transistor is a PMOS transistor, and said pull-down transistor is an NMOS transistor.

8. The level shift circuit according to claim 2, wherein the first switching means is a PMOS transistor, and the second switching means is an NMOS transistor.

9. The level shift circuit according to claim 8, wherein a length of a channel of the PMOS transistor is less than that of the NMOS transistor.

10. The level shift circuit according to claim 2, wherein said pull-up transistor is a PMOS transistor, and said pull-down transistor is an NMOS transistor.

11. The level shift circuit according to claim 8, wherein a length of a channel of the second PMOS transistor is less than a length of a channel of the second NMOS transistor.

* * * * *